(12) United States Patent
Ho et al.

(10) Patent No.: US 12,575,124 B2
(45) Date of Patent: Mar. 10, 2026

(54) SEMICONDUCTOR DEVICE AND METHOD OF MANUFACTURING THE SAME

(71) Applicant: RayNext semiconductor Co., Ltd., Zhubei City (TW)

(72) Inventors: Yen-Teng Ho, Zhubei City (TW); Nai-Jung Chen, Zhubei City (TW)

(73) Assignee: RAYNEXT SEMICONDUCTOR CO., LTD., Zhubei City (TW)

( * ) Notice: Subject to any disclaimer, the term of this patent is extended or adjusted under 35 U.S.C. 154(b) by 364 days.

(21) Appl. No.: 18/375,635

(22) Filed: Oct. 2, 2023

(65) Prior Publication Data

US 2024/0128363 A1 Apr. 18, 2024

(30) Foreign Application Priority Data

Oct. 17, 2022 (CN) .......................... 202211268678.9

(51) Int. Cl.
| | |
|---|---|
| *H10D 30/47* | (2025.01) |
| *H01L 21/02* | (2006.01) |
| *H10D 30/67* | (2025.01) |
| *H10D 62/80* | (2025.01) |
| *H10D 64/62* | (2025.01) |
| *H10D 99/00* | (2025.01) |

(52) U.S. Cl.
CPC ....... *H10D 30/47* (2025.01); *H01L 21/02568* (2013.01); *H10D 30/6735* (2025.01); *H10D 62/80* (2025.01); *H10D 64/62* (2025.01); *H10D 99/00* (2025.01)

(58) Field of Classification Search
CPC ......... H10D 30/47; H10D 30/481–485; H10D 64/62; H01L 21/043; H01L 21/0485; H10K 10/84
See application file for complete search history.

(56) References Cited

U.S. PATENT DOCUMENTS 12,328,892 B2 * 6/2025 Chiu .................... H10D 62/883

* cited by examiner

*Primary Examiner* — Amar Movva
(74) *Attorney, Agent, or Firm* — Birch, Stewart, Kolasch & Birch, LLP

(57) ABSTRACT

A semiconductor device includes a two-dimensional semiconductor layer formed by a two-dimensional semiconductor material having a first formation energy, a two-dimensional metal conductor layer formed by a two-dimensional metal material and covering a surface of the two-dimensional semiconductor layer, and a metal layer covering a surface of the two-dimensional metal conductor layer. The two-dimensional metal material has a second formation energy smaller than the first formation energy. The two-dimensional metal conductor layer is formed by bonding of cations from the metal layer and anions from the two-dimensional semiconductor layer. As such, the contact resistances between the two-dimensional materials and the metals can be effectively reduced, enabling the application of the two-dimensional materials in semiconductor devices such as field-effect transistors.

10 Claims, 5 Drawing Sheets

SEMICONDUCTOR DEVICE AND METHOD OF MANUFACTURING THE SAME

BACKGROUND OF THE INVENTION

1. Field of the Invention

The present invention relates generally to semiconductor devices and more particularly, to a semiconductor device utilizing a two-dimensional material and a method of manufacturing the same.

2. Description of the Related Art

Two-dimensional materials refer to the materials that have only one layer of molecules in the vertical direction, just like a paper, when a crystalline structure is formed. Taking molybdenum disulfide ($MoS_2$) as an example, when viewed from a lateral side, the molybdenum atom is located at the center, and two sulfur atoms are located above and below the molybdenum atom, respectively, resulting in a single-layer thickness of about 0.7 nanometers. When viewed from the top side, these repeated $MoS_2$ molecules form a hexagonal honeycomb-like structure. In the semiconductor processes below 5 nm, molybdenum disulfide is one of the materials first considered for use in the channel of transistors. The main advantage is that its leakage current is several orders of magnitude smaller than that of silicon, leading to low power consumption. The primary reason for this phenomenon is that the effective mass of electrons in molybdenum disulfide is about three times larger than that in silicon. Experimental results have already demonstrated excellent properties when the molybdenum disulfide material is used in field-effect transistors, making the two-dimensional materials, such as molybdenum disulfide, expected to replace silicon as the primary semiconductor channel material for technologies below the 2-nanometer node.

However, since there are no dangling bonds on the surfaces of the two-dimensional materials, it is difficult for the two-dimensional materials to form covalent bonds with metals, and the Van der Waals gap at the interface makes it difficult to reduce the Schottky barrier. The interface between the metal and the two-dimensional semiconductor is prone to have Fermi level pinning, so the high contact resistance between the two-dimensional material and the metal is still an obstacle to the application of the two-dimensional materials in field-effect transistors.

To achieve ohmic contact between two-dimensional materials and metals, hydrogen ($H_2$) or helium (He) plasma is currently used to treat the surface of two-dimensional materials such as $WSe_2$, which can form selenium (Se) vacancy on the surface so as to increase the surface carrier concentration (ND) at room temperature to be greater than $4 \times 10^{17}$ $cm^{-3}$. The contact between the high carrier concentration $WSe_2$ surface and the metal can reduce the Schottky barrier, thereby reducing the contact resistance. However, this method will cause damage to the surface of $WSe_2$. The damaged surface is easily oxidized by oxygen in the environment, and the stability of the process is difficult to control.

Another approach is to insert two-dimensional materials having metallic properties, such as graphene, in between Ag and $MoS_2$. The result shows good electrical properties, the Schott barrier (SBH) is significantly reduced from 300 meV to 190 meV, and the current switching ratio reaches $4 \times 10^8$. However, the mature manufacturing process for graphene typically involves high-temperature growth on copper foil and then transfer onto components by a peel-and-stick way, which is not easily compatible with the semiconductor CMOS manufacturing process.

In view of the above, finding a stable and feasible method for creating ohmic contact between two-dimensional materials and metals to enable the successful application of the two-dimensional materials in semiconductor devices, such as field-effect transistors, remains a challenge in the industry.

SUMMARY OF THE INVENTION

The present invention has been accomplished in view of the above-noted circumstances. It is an objective of the present invention to provide a semiconductor device capable of effectively reducing the contact resistance between two-dimensional materials and metals, thereby enabling the successful application of the two-dimensional materials in semiconductor devices, such as field-effect transistors.

Another objective of the present invention is to provide a method for manufacturing such a semiconductor device, which can reduce the contact resistance between two-dimensional materials and metals and avoid oxidation during the manufacturing steps.

To attain the above-mentioned objectives, the present invention provides a semiconductor device comprising a two-dimensional semiconductor layer, a two-dimensional metal conductor layer, and a metal layer. The two-dimensional semiconductor layer is formed by a two-dimensional semiconductor material having a first formation energy. The two-dimensional metal conductor layer is formed by a two-dimensional metal material and covers a surface of the two-dimensional semiconductor layer. The two-dimensional metal material has a second formation energy smaller than the first formation energy. The metal layer covers a surface of the two-dimensional metal conductor layer. The two-dimensional metal conductor layer is formed by bonding of cations from the metal layer and anions from the two-dimensional semiconductor layer. As a result, the contact resistance between two-dimensional materials and metals can be effectively reduced, enabling the application of the two-dimensional materials in semiconductor devices, such as field-effect transistors.

To attain the above-mentioned objectives, the present invention provides a method of manufacturing a semiconductor device, which comprises the steps of (A) forming a metal layer on a two-dimensional semiconductor layer, and (B) annealing in a controlled atmosphere at a temperature ranging from 600° C. to 1000° C. to enable that metal cations from the metal layer and anions from the two-dimensional semiconductor layer are bonded to form a two-dimensional metal conductor layer. With this method, the contact resistance between two-dimensional materials and metals can be reduced, and oxidation during the manufacturing steps can be avoided.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
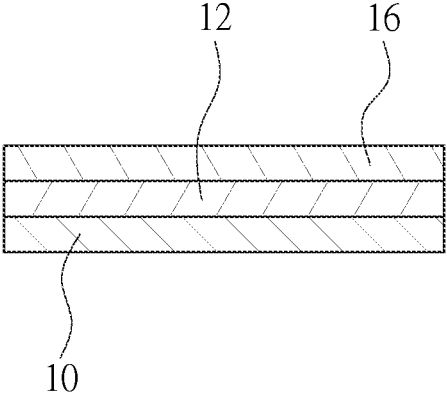
FIG. 1 is a schematic view showing partially manufacturing steps of a semiconductor device in accordance with an embodiment of the present invention.
Figure 1:
Figure 1:
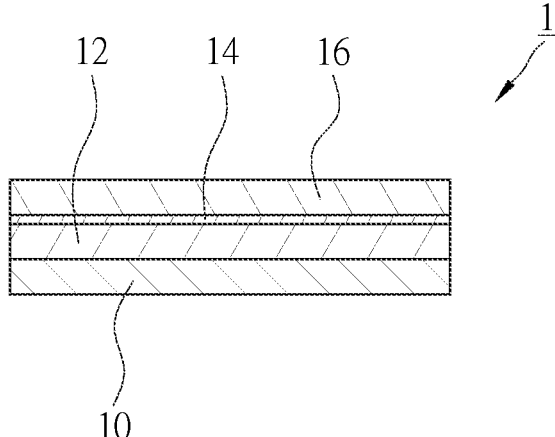

Hereunder an embodiment will be detailedly described with accompanying drawings for illustrating technical features and structure of the present invention. As shown in FIG. 1, a method of manufacturing a semiconductor device 1 provided in accordance with a preferred embodiment of the present invention includes the following steps of: (A) forming a two-dimensional semiconductor layer 12 on a substrate 10 by using chemical vapor deposition (CVD), molecular beam epitaxy, or laser epitaxy, and then forming a metal layer 16 on the two-dimensional semiconductor layer 12 by using sputtering, electron beam evaporation, or thermal evaporation; and (B) annealing the semifinished product obtained in the step (A) in a controlled atmosphere at a temperature ranging from 600 to 1000° C., enabling that cations from the metal layer 16 are bonded with anions from the two-dimensional semiconductor layer 12 so as to form a two-dimensional metal conductor layer 14 between the metal layer 16 and the two-dimensional semiconductor layer 12.

For the substrate 10, a three-dimensional material, such as silicon (Si), may be used to make the substrate 10. In another embodiment, sapphire, quartz, silicon carbide (SiC), aluminum nitride (AlN), gallium nitride (GaN), silicon for grown silicon dioxide ($SiO_2$/Si), silicon for grown silicon nitride ($SiN_x$/Si), or other amorphous insulating materials may be used as the material for making the substrate 10. Alternately, a two-dimensional material, such as mica, may be used to make the substrate 10.

The two-dimensional semiconductor layer 12 is formed by two-dimensional semiconductor materials, such as molybdenum disulfide ($MoS_2$), exhibiting semiconductor properties. The two-dimensional semiconductor materials have a first formation energy. In this embodiment, the formation energy of $MoS_2$ is −1.059 eV/atom. The greater the negative value of the formation energy, i.e., the smaller the value, the more stable the synthesis reactants are and the easier they are to form.

The metal layer 16 is a niobium (Nb) layer. The controlled atmosphere includes 85 vol % nitrogen gas and 15 vol % hydrogen gas. During annealing, because the formation energy of niobium disulfide ($NbS_2$) is −1.207 eV/atom, which is smaller than the formation energy of molybdenum disulfide ($MoS_2$) at −1.059 eV/atom, the $Nb^+$ ions in the metal layer 16 can bond with the $S^+$ ions in the two-dimensional semiconductor layer 12 (i.e., molybdenum disulfide layer), thereby forming a layer of niobium disulfide ($NbS_2$) between the metal layer 16 and the two-dimensional semiconductor layer 12. Since niobium disulfide is a two-dimensional metal material with metallic conductor properties, this niobium disulfide layer is referred to as the two-dimensional metal conductor layer 14, which structurally covers over the surface of the two-dimensional semiconductor layer 12. The two-dimensional metal material in this embodiment has a second formation energy, which is smaller than the first formation energy. Once the two-dimensional metal conductor layer 14 is formed, the metal layer 16 essentially covers over the surface of the two-dimensional metal conductor layer 14. In other words, the two-dimensional metal conductor layer 14 is formed by the bonding of cations from the metal layer 16 and anions from the two-dimensional semiconductor layer 14.

Since the sulfur atoms in molybdenum disulfide ($MoS_2$) in the two-dimensional semiconductor layer 12 are taken away by niobium atoms, this results in the phenomenon of surface sulfur vacancies (S vacancy). This can increase the surface carrier concentration without incurring the result of damaging the surface or oxidation. Niobium disulfide, which has metallic conductor properties, plays a role similar to the graphene in the prior arts, thereby significantly reducing the Schottky barrier between the metal layer 16 and the two-dimensional semiconductor layer 12. Moreover, the manufacturing steps of the method of the present invention are compatible with semiconductor CMOS processes. Therefore, the manufacturing method provided by the present invention can successfully achieve ohmic contact between two-dimensional materials and metals, reducing the contact resistance between them. This enables the successful application of two-dimensional materials in semiconductor devices, such as field-effect transistors, thus achieving the objectives of the present invention.

It is to be further mentioned that in step (B), the controlled atmosphere containing nitrogen gas and hydrogen gas can have a nitrogen-to-hydrogen ratio that varies as needed within the range of 80:20 to 90:10, and the annealing temperature can also be adjusted as needed.

In addition to the aforementioned embodiment, other two-dimensional semiconductor materials and two-dimensional metal materials may be used in the present invention as long as they meet the condition that the second formation energy is smaller than the first formation energy. Table 1 lists the values of the first formation energy for various two-dimensional semiconductor materials having semiconductor properties, while Table 2 provides the values of the second formation energy for various two-dimensional metal materials having metallic conductor properties.

TABLE 1

| Two-dimensional semiconductor material | | Formation energy (eV/atom) |
|---|---|---|
| Sulfide | $MoS_2$ | −1.059 |
| | $WS_2$ | −1.012 |
| | $TiS_2$ | −1.463 |
| | $VS_2$ | −1.044 |
| | $NiS_2$ | −0.449 |
| | $PdS_2$ | −0.460 |
| | $PtS_2$ | −0.544 |
| Selenide | $MoSe_2$ | −0.679 |
| | $WSe_2$ | −0.563 |
| | $PdSe_2$ | −0.282 |
| | $PtSe_2$ | −0.388 |
| Telluride | $MoTe_2$ | −0.271 |

TABLE 2

| Two-dimensional metal material | | Formation energy (eV/atom) |
|---|---|---|
| Sulfide | $NbS_2$ | −1.207 |
| | $TaS_2$ | −1.242 |
| | $VS_2$ | −1.044 |
| | $FeS_2$ | −0.701 |

5

TABLE 2-continued

| Two-dimensional metal material | | Formation energy (eV/atom) |
|---|---|---|
| Selenide | $NbSe_2$ | −0.849 |
| | $TaSe_2$ | −0.818 |
| | $VSe_2$ | −0.699 |
| | $TiSe_2$ | −1.121 |
| Telluride | $NbTe_2$ | −0.460 |
| | $TiTe_2$ | −0.708 |
| | $HfTe_2$ | −0.827 |
| | $ZrTe_2$ | −0.880 |

Since the formation energies in Tables 1 and 2 were obtained under the same equipment and factors, their relative magnitudes provide reference value. Through actual experiments, for sulfides, the combinations of the two-dimensional semiconductor materials and the two-dimensional metal materials may be as follows:

molybdenum disulfide ($MoS_2$) and niobium disulfide ($NbS_2$); tungsten disulfide ($WS_2$) and niobium disulfide ($NbS_2$), vanadium disulfide ($VS_2$) and niobium disulfide ($NbS_2$), nickel disulfide ($NiS_2$) and niobium disulfide ($NbS_2$); palladium disulfide ($PdS_2$) and niobium disulfide ($NbS_2$); platinum disulfide ($PtS_2$) and niobium disulfide ($NbS_2$); molybdenum disulfide ($MoS_2$) and tantalum disulfide ($TaS_2$) tungsten disulfide ($WS_2$) and tantalum disulfide ($TaS_2$); vanadium disulfide ($VS_2$) and tantalum disulfide ($TaS_2$); nickel disulfide ($NiS_2$) and tantalum disulfide ($TaS_2$); palladium disulfide ($PdS_2$) and tantalum disulfide ($TaS_2$); platinum disulfide ($PtS_2$) and tantalum disulfide ($TaS_2$); tungsten disulfide ($WS_2$) and vanadium disulfide ($VS_2$); nickel disulfide ($NiS_2$) and vanadium disulfide ($VS_2$); palladium disulfide ($PdS_2$) and vanadium disulfide ($VS_2$); platinum disulfide ($PtS_2$) and vanadium disulfide ($VS_2$); nickel disulfide ($NiS_2$) and iron disulfide ($FeS_2$); palladium disulfide ($PdS_2$) and iron disulfide ($FeS_2$); or platinum disulfide ($PtS_2$) and iron disulfide ($FeS_2$). Accordingly, for the metal layer 16, niobium, tantalum, vanadium, or iron may be used to form the metal layer 16.

For selenides, the combinations of the two-dimensional semiconductor materials and the two-dimensional metal materials may be as follows:

molybdenum diselenide ($MoSe_2$) and niobium diselenide ($NbSe_2$); tungsten diselenide ($WSe_2$) and niobium diselenide ($NbSe_2$); palladium diselenide ($PdSe_2$) and niobium diselenide ($NbSe_2$); platinum diselenide ($PtSe_2$) and niobium diselenide ($NbSe_2$); molybdenum diselenide ($MoSe_2$) and tantalum diselenide ($TaSe_2$); tungsten diselenide ($WSe_2$) and tantalum diselenide ($TaSe_2$); palladium diselenide ($PdSe_2$) and tantalum diselenide ($TaSe_2$); platinum diselenide ($PtSe_2$) and tantalum diselenide ($TaSe_2$); molybdenum diselenide ($MoSe_2$) and vanadium diselenide ($VSe_2$); tungsten diselenide ($WSe_2$) and vanadium diselenide ($VSe_2$); palladium diselenide ($PdSe_2$) and vanadium diselenide ($VSe_2$); platinum diselenide ($PtSe_2$) and vanadium diselenide ($VSe_2$); molybdenum diselenide ($MoSe_2$) and titanium diselenide ($TiSe_2$); tungsten diselenide ($WSe_2$) and titanium diselenide ($TiSe_2$); palladium diselenide ($PdSe_2$) and titanium diselenide ($TiSe_2$); or platinum diselenide ($PtSe_2$) and titanium diselenide ($TiSe_2$). Accordingly; niobium, tantalum, vanadium, or titanium may be used to form the metal layer 16.

For tellurides, the combinations of the two-dimensional semiconductor materials and the two-dimensional metal materials may be as follows:

molybdenum ditelluride ($MoTe_2$) and niobium ditelluride ($NbTe_2$); molybdenum ditelluride ($MoTe_2$) and titanium ditelluride ($TiTe_2$); molybdenum ditelluride ($MoTe_2$) and hafnium ditelluride ($HfTe_2$); or molybdenum ditelluride ($MoTe_2$) and zirconium ditelluride ($ZrTe_2$). Accordingly, niobium, titanium, hafnium, or zirconium may be used to form the metal layer 16. It is to be understood that the two-dimensional semiconductor materials and the two-dimensional metal materials are not limited to the examples listed above.

Figure 2:
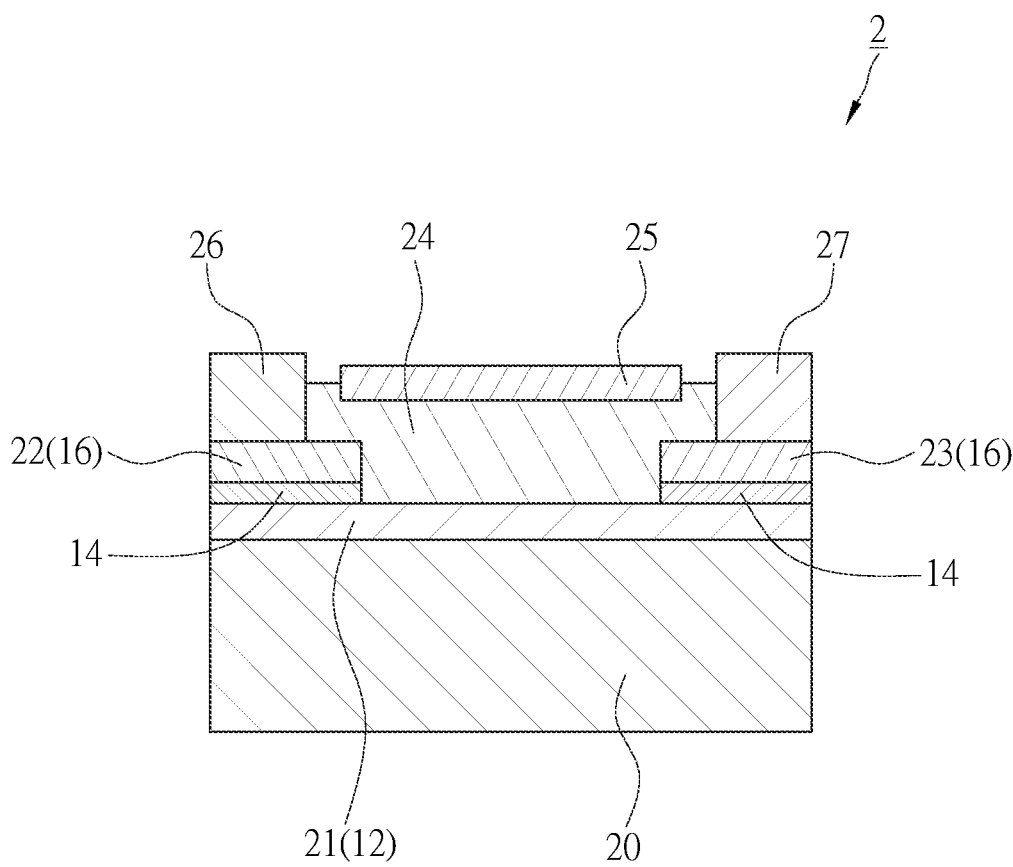
FIG. 2 is a schematic view showing that the semiconductor device of the embodiment of the present invention is applied in a field-effect transistor.

The semiconductor device of the present invention can be applied to field-effect transistors, gate-all-around field-effect transistors, or other devices. FIG. 2 is a schematic drawing depicting that the semiconductor device of the present invention is applied to a field-effect transistor 2. The field-effect transistor 2 includes a substrate 20, a channel 21, a source 22, a drain 23, a dielectric layer 24, a gate 25, a source pad 26, and a drain pad 27. In this embodiment, the two-dimensional semiconductor layer 12 serves as the channel 21, and the metal layer 16 serves as the source 22 and drain 23. With this structural feature, the channel 21 made of the above-mentioned two-dimensional semiconductor material and the source 22 and drain 23 made of the above-mentioned metal material will have good ohmic contact due to the presence of the two-dimensional metal conductor layer 14 therebetween. This effectively reduces the contact resistance between the two-dimensional material and the metal in the prior arts, allowing two-dimensional materials to be successfully applied to semiconductor devices, such as field-effect transistors.

Figure 3:
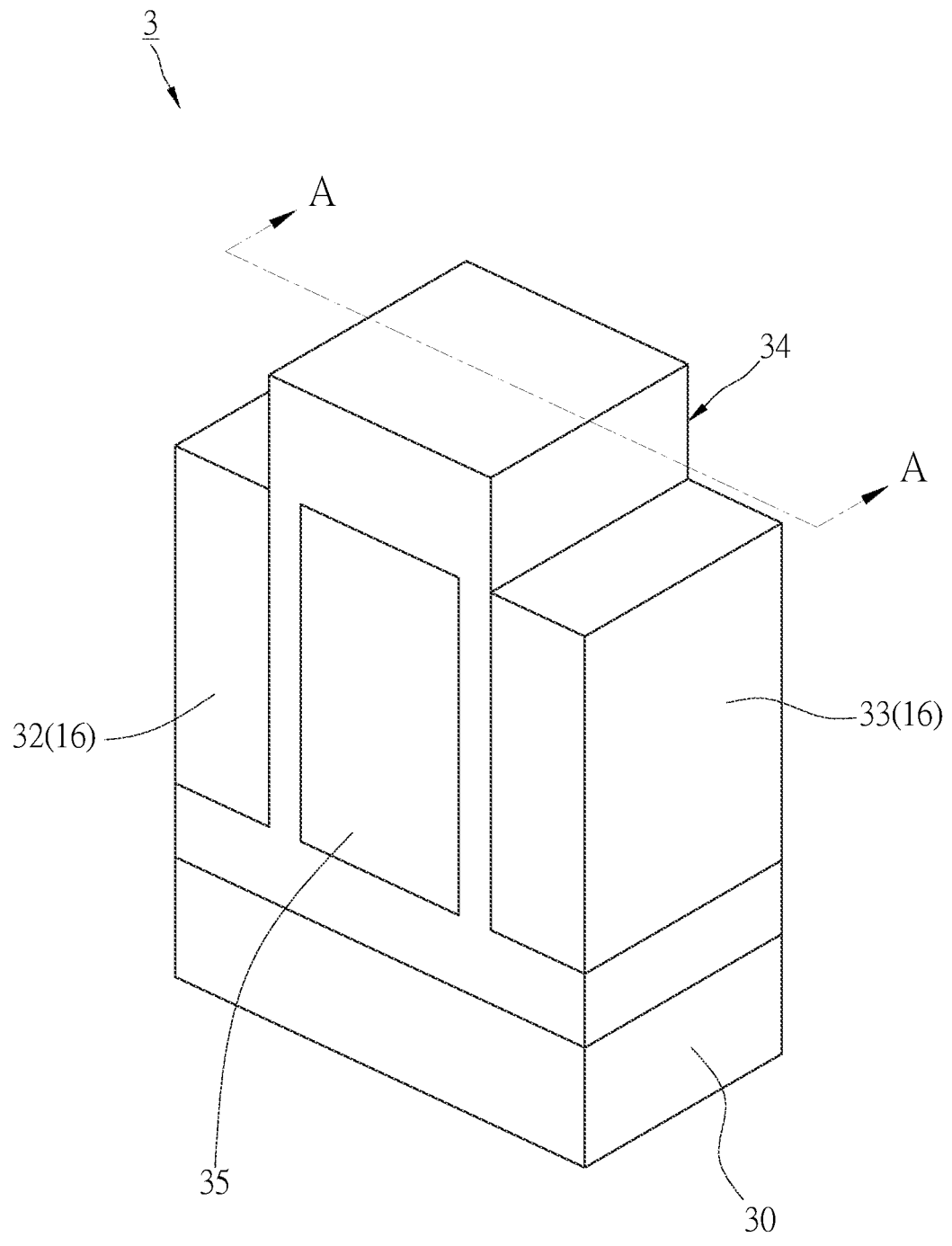
FIG. 3 is a perspective view showing that the semiconductor device of the embodiment of the present invention is applied in a gate-all-around field-effect transistor.
Figure 4:
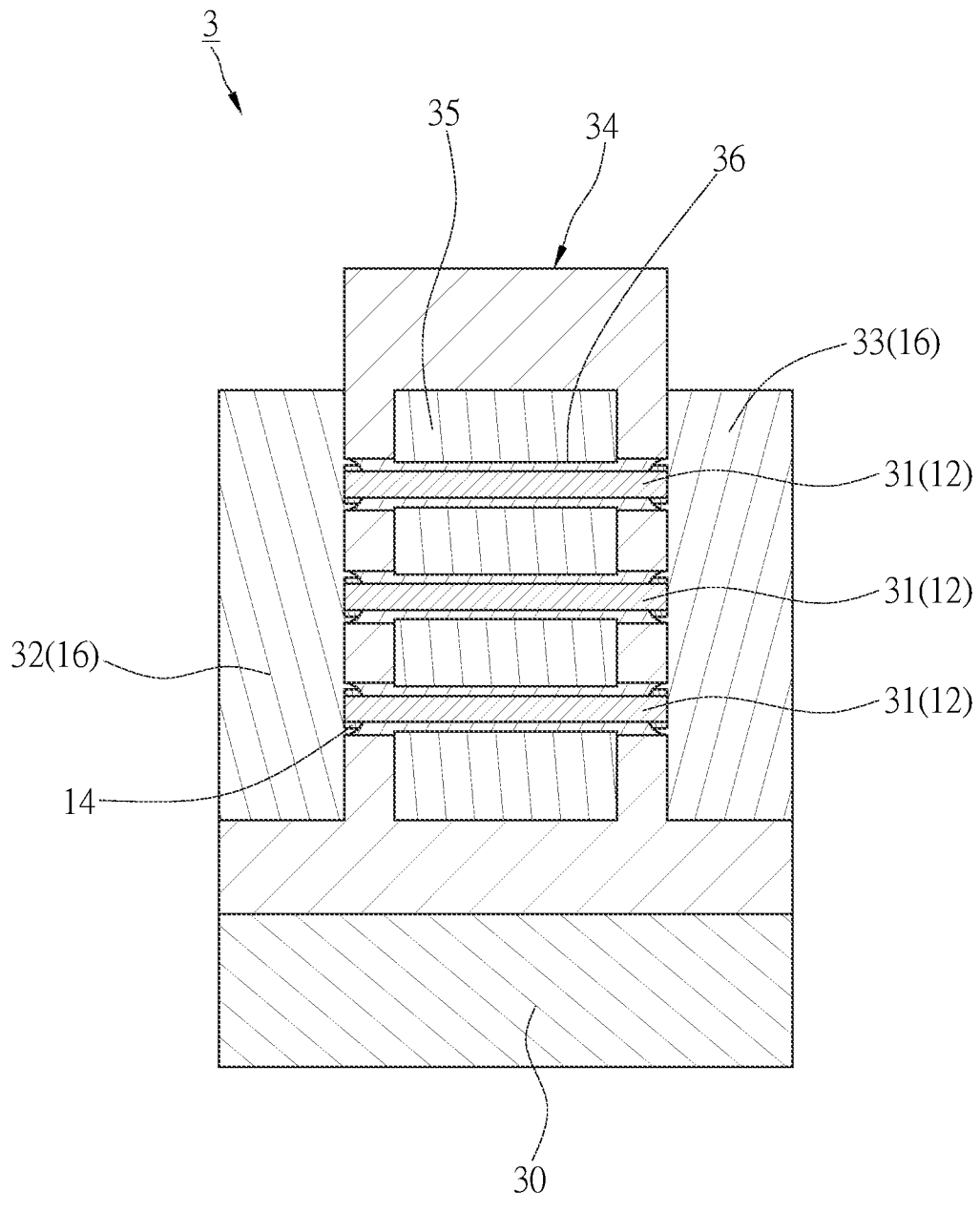
FIG. 4 is a sectional view taken along line A-A of FIG. 3.

Furthermore, FIGS. 3 and 4 are schematic drawings depicting that the semiconductor device of the present invention is applied to a gate-all-around field-effect transistor 3. The gate-all-around field-effect transistor 3 includes a substrate 30, three channels 31, a source 32, a drain 33, a dielectric layer 34, a gate 35, and three insulating layers 36. In this embodiment, the two-dimensional semiconductor layer 12 serves as the channel 31, and the metal layer 16 serves as the source 32 and drain 33. With this structural feature, the channels 31 made of the above-mentioned two-dimensional semiconductor material and the source 32 and drain 33 made of the above-mentioned metal material will have good ohmic contact due to the presence of the two-dimensional metal conductor layers 14 therebetween, thereby achieving the objectives of the present invention.

Figure 5:
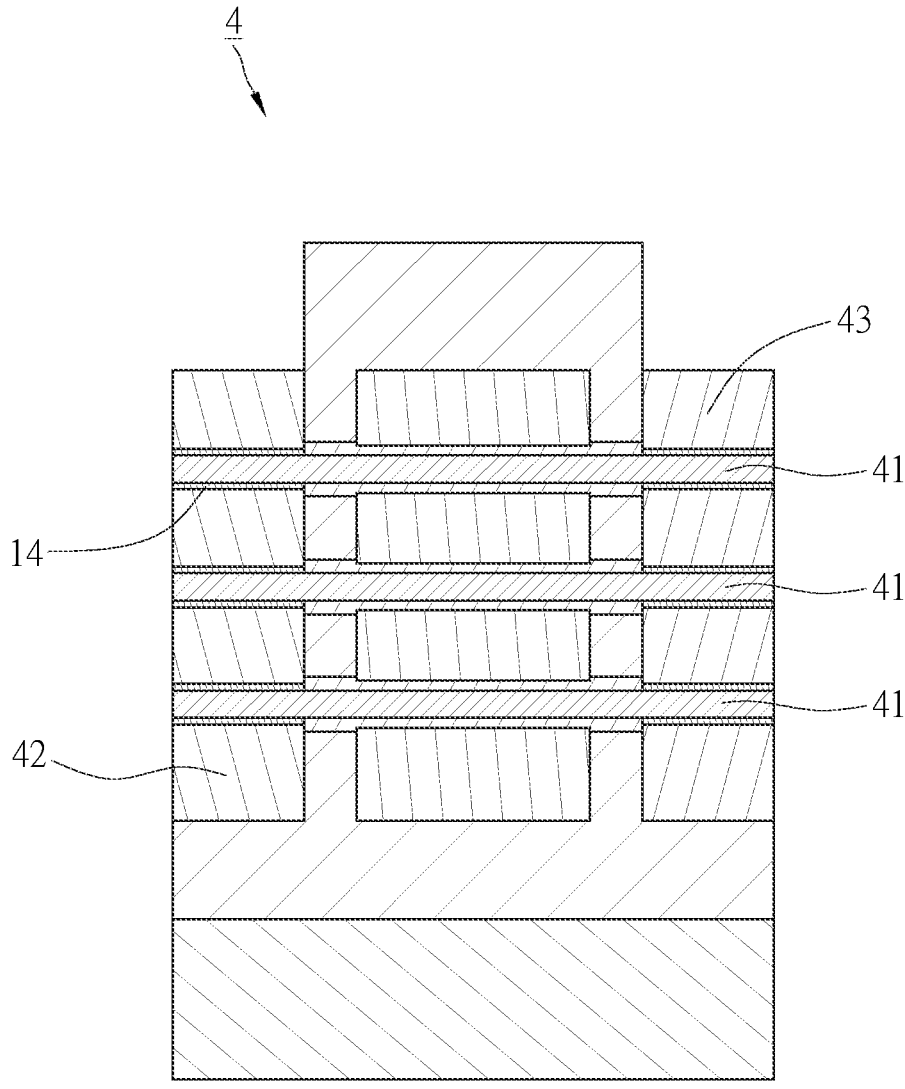
FIG. 5 is a sectional view showing that the semiconductor device of the embodiment of the present invention is applied in another gate-all-around field-effect transistor.

FIG. 5 is a schematic drawing depicting that the semiconductor device of the present invention is applied to another gate-all-around field-effect transistor 4. The structure of the gate-all-around field-effect transistor 4 is generally similar to that of the aforesaid field-effect transistor 3, with the difference lying in that the two ends of each of the three channels 41 extend into the source 42 and drain 43. The channels 41 made of the above-mentioned two-dimensional semiconductor material and the source 42 and drain 43 made of the above-mentioned metal material in this embodiment will also have good ohmic contact due to the presence of the two-dimensional metal conductor layers 14 therebetween, thereby achieving the objectives of the present invention.

What is claimed is:

1. A semiconductor device, comprising:

a two-dimensional semiconductor layer formed by a two-dimensional semiconductor material having a first formation energy;

a two-dimensional metal conductor layer formed by a two-dimensional metal material and covering a surface of the two-dimensional semiconductor layer, the two-dimensional metal material having a second formation energy smaller than the first formation energy; and a metal layer covering a surface of the two-dimensional metal conductor layer;

wherein the two-dimensional metal conductor layer is formed by bonding of cations from the metal layer and anions from the two-dimensional semiconductor layer.

2. The semiconductor device as claimed in claim 1, wherein the two-dimensional semiconductor material and the two-dimensional metal material are $MoS_2$ and $NbS_2$, $WS_2$ and $NbS_2$, $VS_2$ and $NbS_2$, $NiS_2$ and $NbS_2$, $PdS_2$ and $NbS_2$, $PtS_2$ and $NbS_2$, $MoS_2$ and $TaS_2$, $WS_2$ and $TaS_2$, $VS_2$ and $TaS_2$, $NiS_2$ and $TaS_2$, $PdS_2$ and $TaS_2$, $PtS_2$ and $TaS_2$, $WS_2$ and $VS_2$, $NiS_2$ and $VS_2$, $PdS_2$ and $VS_2$, $PtS_2$ and $VS_2$, $NiS_2$ and $FeS_2$, $PdS_2$ and $FeS_2$, or $PtS_2$ and $FeS_2$, respectively.

3. The semiconductor device as claimed in claim 2, wherein the metal layer is formed by niobium, tantalum, vanadium, or iron.

4. The semiconductor device as claimed in claim 1, wherein the two-dimensional semiconductor material and the two-dimensional metal material are $MoSe_2$ and $NbSe_2$, $WSe_2$ and $NbSe_2$, $PdSe_2$ and $NbSe_2$, $PtSe_2$ and $NbSe_2$, $MoSe_2$ and $TaSe_2$, $WSe_2$ and $TaSe_2$, $PdSe_2$ and $TaSe_2$, $PtSe_2$ and $TaSe_2$, $MoSe_2$ and $VSe_2$, $WSe_2$ and $VSe_2$, $PdSe_2$ and $VSe_2$, $PtSe_2$ and $VSe_2$, $MoSe_2$ and $TiSe_2$, $WSe_2$ and $TiSe_2$, $PdSe_2$ and $TiSe_2$, or $PtSe_2$ and $TiSe_2$, respectively.

5. The semiconductor device as claimed in claim 4, wherein the metal layer is formed by niobium, tantalum, vanadium, or titanium.

6. The semiconductor device as claimed in claim 1, wherein the two-dimensional semiconductor material and the two-dimensional metal material are $MoTe_2$ and $NbTe_2$, $MoTe_2$ and $TiTe_2$, $MoTe_2$ and $HfTe_2$, or $MoTe_2$ and $ZrTe_2$, respectively.

7. The semiconductor device as claimed in claim 6, wherein the metal layer is formed by niobium, titanium, hafnium, or zirconium.

8. The semiconductor device as claimed in claim 1, wherein the two-dimensional semiconductor layer serves as a channel, and the metal layer serves as a source or a drain.

9. A method of manufacturing the semiconductor device of claim 1, comprising the steps of:

(A) forming a metal layer on a two-dimensional semiconductor layer; and (B) annealing in a controlled atmosphere at a temperature ranging from 600° C. to 1000° C. to enable that metal cations from the metal layer and anions from the two-dimensional semiconductor layer are bonded to form a two-dimensional metal conductor layer.

10. The method as claimed in claim 9, wherein in the step (B) the controlled atmosphere comprises nitrogen gas and hydrogen gas, which have a nitrogen-to-hydrogen ratio ranging from 80:20 to 90:10.

* * * * *